United States Patent
Pon et al.

(10) Patent No.: US 11,562,978 B2
(45) Date of Patent: Jan. 24, 2023

(54) DECOUPLING CAPACITOR MOUNTED ON AN INTEGRATED CIRCUIT DIE, AND METHOD OF MANUFACTURING THE SAME

(71) Applicant: Intel Corporation, Santa Clara, CA (US)

(72) Inventors: Florence R. Pon, Folsom, CA (US); Tyler Leuten, Orangevale, CA (US); John K. Yap, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/468,264

(22) PCT Filed: Dec. 31, 2016

(86) PCT No.: PCT/US2016/069646
§ 371 (c)(1),
(2) Date: Jun. 10, 2019

(87) PCT Pub. No.: WO2018/125256
PCT Pub. Date: Jul. 5, 2018

(65) Prior Publication Data
US 2019/0312005 A1    Oct. 10, 2019

(51) Int. Cl.
*H01L 23/00* (2006.01)
*H01L 23/50* (2006.01)
*H01L 23/528* (2006.01)
*H01L 25/065* (2006.01)

(52) U.S. Cl.
CPC ............. *H01L 24/48* (2013.01); *H01L 23/50* (2013.01); *H01L 23/528* (2013.01); *H01L 24/49* (2013.01);
(Continued)

(58) Field of Classification Search
CPC ......... H01L 24/48; H01L 24/49; H01L 23/50; H01L 23/528; H01L 25/0657;
(Continued)

(56) References Cited

U.S. PATENT DOCUMENTS 6,191,479 B1 * 2/2001 Herrell ................ H01L 23/5223
257/532
8,710,623 B1 * 4/2014 Mayder ................... H01L 28/86
257/532

(Continued)

FOREIGN PATENT DOCUMENTS

| CN | 1705119 A | 12/2005 |
|---|---|---|
| CN | 203733790 U | 7/2014 |
| JP | 2007/243229 A | 9/2007 |

OTHER PUBLICATIONS

PCT Application No. PCT/US2016/069646 Filing date Dec. 31, 2016; Florence R. Pon, International Search Report dated Dec. 6, 2017. 7 Pages.

*Primary Examiner* — Dale E Page
*Assistant Examiner* — Quovaunda Jefferson
(74) *Attorney, Agent, or Firm* — Schwabe, Williamson & Wyatt, P.C.

(57) ABSTRACT

Electronic device package technology is disclosed. In one example, an electronic device comprises a die (18) having a bond pad (22); and a decoupling capacitor (14) mounted on the die (18) and electrically coupled to the die (18). A method for making an electronic device comprises mounting a decoupling capacitor (14) on a die (18); and electrically coupling the decoupling capacitor (14) to the die (18).

30 Claims, 6 Drawing Sheets

(52) U.S. Cl.
CPC .................. *H01L 25/0657* (2013.01); *H01L 2224/48091* (2013.01); *H01L 2224/48145* (2013.01); *H01L 2224/48491* (2013.01); *H01L 2224/49175* (2013.01); *H01L 2224/49429* (2013.01); *H01L 2225/0651* (2013.01); *H01L 2225/06506* (2013.01); *H01L 2225/06513* (2013.01); *H01L 2225/06562* (2013.01); *H01L 2225/06593* (2013.01); *H01L 2924/00014* (2013.01); *H01L 2924/0132* (2013.01); *H01L 2924/0133* (2013.01); *H01L 2924/07811* (2013.01); *H01L 2924/10253* (2013.01); *H01L 2924/14* (2013.01); *H01L 2924/19041* (2013.01); *H01L 2924/19104* (2013.01); *H01L 2924/38* (2013.01)

(58) Field of Classification Search
CPC . H01L 2224/48091; H01L 2224/48145; H01L 2224/48491; H01L 2224/49175; H01L 2224/49429; H01L 2225/06506; H01L 2225/0651; H01L 2225/06513; H01L 2225/06562; H01L 2225/06593; H01L 2924/00014; H01L 2924/0132; H01L 2924/0133; H01L 2924/07811; H01L 2924/10253; H01L 2924/14; H01L 2924/19041; H01L 2924/19104; H01L 2924/38

See application file for complete search history.

(56) References Cited

U.S. PATENT DOCUMENTS

2004/0127011 A1 7/2004 Huang et al.
2012/0068306 A1* 3/2012 Song ................ H01L 24/49
257/532

* cited by examiner

DECOUPLING CAPACITOR MOUNTED ON AN INTEGRATED CIRCUIT DIE, AND METHOD OF MANUFACTURING THE SAME

PRIORITY INFORMATION

This application is a 371 U.S. national stage entry of PCT Application Serial No. PCT/US2016/069646, filed Dec. 31, 2016, which is incorporated herein by reference in its entirety.

TECHNICAL FIELD

Embodiments described herein relate generally to an electronic device, and more particularly to an electronic device having a decoupling capacitor mounted to a die.

BACKGROUND

The ever-shrinking form factor of electronic devices has created a perpetual need to make electronic assemblies (and their sub-assemblies) smaller and smaller. Demands are put on industry to increase memory integrated circuit (IC) and hardware performance, while shrinking the overall size and form factor. As memory chip data speeds increase and new litho technologies are developed, increased silicon capacitance is needed for stable performance. The increased need of capacitance is outstripped by the available amount which is able to be built into the die.

For higher speed IC devices, current solutions are to convert wire bonded connected IC's to flip chip. By doing so, power delivery can be improved by having many more pads for power, as well as shorten the connection between the IC die and the package external connections. One issue with flip chips is the cost to stack multiple flip chip die in the same package. The increased cost of implementing flip chip and through-silicon via (TSV) has yet to be justified in a commodity driven market.

It is generally advantageous to place decoupling capacitors as close to the power connections for the die as possible to help with power distribution delivery in power consuming designs when the operational voltages go down and speed requirements go up. These decoupling capacitors help smooth out the di/dt current response and make up the difference with the extra charge that the die pads on the IC device need to operate properly. Because of the ever-shrinking space, the issue of where to place the capacitors in order to minimize package size while improving function is often an issue.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein:

FIG. 2b schematically shows a partial side view of the electronic device of FIG. 2a;

FIG. 3b schematically shows a partial side view of the electronic device of FIG. 3a;

FIG. 4b schematically shows a partial side view of the electronic device of FIG. 4a;

FIG. 5b schematically shows a partial side view of the electronic device of FIG. 5a;

FIG. 6b schematically shows a partial side view of the electronic device of FIG. 6a;

Figure 1A:
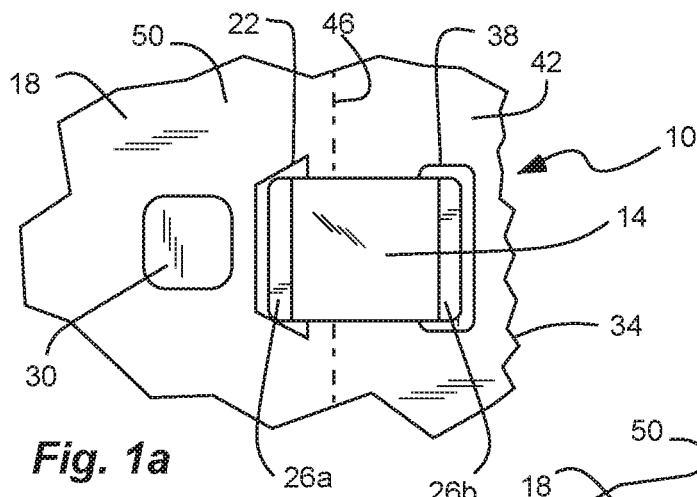
FIG. 1a schematically shows a partial top view of an electronic device with a decoupling capacitor mounted on a die in accordance with one example embodiment.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or items are in physical contact with one another and attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

In one example, decoupling capacitors can be placed directly on silicon of a die. In addition, the decoupling capacitors can be ultra-small, e.g. 0.25×0.125 mm, surface mounted capacitors. In one aspect, a decoupling capacitor can be placed in a die scribe region and/or anywhere else surface-mount technology (SMT) pads can be created and utilized. In another aspect, a surface mount decoupling capacitor can be mounted pad-to-pad on the same die. In another aspect, a surface mount decoupling capacitor can be mounted pad-to-pad on an adjacent die in the same stack. Additional substrate space may not be required for capacitor placement. In addition, electrical performance may increase due to the close placement of the capacitor.

In one example, an electronic device can comprise a die having a bond pad. A decoupling capacitor can be mounted on the die and electrically coupled to the die. In one aspect, the decoupling capacitor can be mounted directly on a surface of the die. In another example, an electronic device package can comprise a substrate, and a die coupled to the substrate. The die can have a target bond pad. A bond wire can be coupled between the target bond pad and the substrate. A decoupling capacitor can be mounted on the die and electrically coupled to the die.

In one example, a method for making an electronic device can comprise: mounting a decoupling capacitor on a die; and electrically coupling the decoupling capacitor to the die. In another example, a method for making an electronic device package can comprise: obtaining a substrate; disposing a die on the substrate; mounting a decoupling capacitor on a die; and electrically coupling the decoupling capacitor to the die.

Referring to FIGS. 1a-d, a decoupling capacitor is shown mounted to a die in accordance with one example embodiment. FIG. 1a shows a schematic partial top view of an electronic device 10 having a decoupling capacitor 14 mounted on a die 18 in accordance with an example. The decoupling capacitor 14 can be mounted directly on a surface of the die 18. In one aspect, the decoupling capacitor 14 can be mounted in contact with a silicon material of the die 10, or an exposed surface of the die comprising silicon. The decoupling capacitor 14 can be a surface mount capacitor with opposite contacts 26a and 26b. One of the contacts 26a can be disposed on and electrically coupled to the bond pad 22. In one aspect, a contact 26a or 26b can be coupled to the bond pad 22 with solder, solder paste or conductive paste.

Figure 1B:
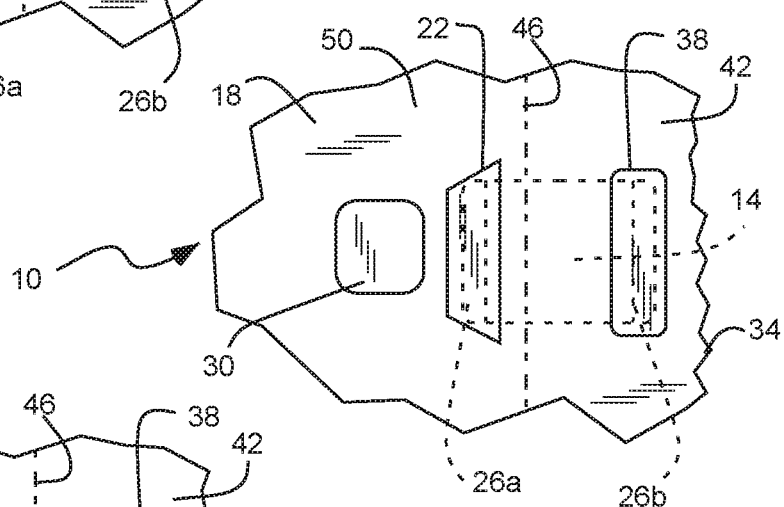
FIG. 1b schematically shows a partial top view of the electronic device of FIG. 1a with the decoupling capacitor shown in phantom lines to see bond pads on the die.

FIG. 1b shows a schematic partial top view of the electronic device 10 of FIG. 1a showing only the die 18 with a bond pad 22 (and with the decoupling capacitor 14 shown in phantom to see the bond pads 22 and 38). The bond pad 22 can be located adjacent to a target wire bond pad 30, and between the target wire bond pad 30 and a cut edge 34 of the die 18. The target wire bond pad 30 receives a bond wire 54, as described in greater detail below. A corresponding bond pad 38 (corresponding the other bond pad 22 coupled the decoupling capacitor 14) can be disposed in a scribe region 42 of the die 18. The scribe region 42 can be between the active region 50 of the die 18 and the cut edge 34 of the die 18. The bond pads 22 and 38 can be surface mount technology (SMT) pads. The bond pads 22 and 38 can be created without utilizing much active dies space by using neglected die space in the die scribe region 42. The bond pads 22 and 38 can be attached prior to wire bonding to ensure that the bond pads 22 and 38 will not interfere with the wire bonding process. Silicon of the die 18 can withstand temperatures for solder reflow, and if the silicon is exposed, the maximum peak reflow temperatures can be adjusted down since heat transfer through a semiconductor material is far more effective than through normal printed circuit board (PCB) materials. If the particular silicon is temperature sensitive, rather than using the typical tin-silver-copper (Sn—Ag—Cu) alloys, other softer, lead-free alloys can be used, like lanthanide-tin (In—Sn) or lanthanide-bismuth (In—Bi) or conductive silver (Ag) filled pastes.

The decoupling capacitor 14 has one contact 26a disposed on and electrically coupled to the bond pad 22 adjacent the target wire bond pad 30, and another contact disposed on the corresponding bond pad 38 in the scribe region 42. Thus, the decoupling capacitor 14 can straddle a boundary 46 between an active region 50 of the die 18 and the scribe region 42 of the die 18. In addition, the decoupling capacitor 14 can have one contact 26a in the active region 50 of the die 18, and another contact 26b in the scribe region 42 of the die 18. Furthermore, the decoupling capacitor 14 can be disposed between the target wire bond pad 30 and the cut edge 34 of the die 18. Therefore, the decoupling capacitor 14 can be coupled to the die to increase capacitance for stable performance of the die, without requiring additional space.

Figure 1C:
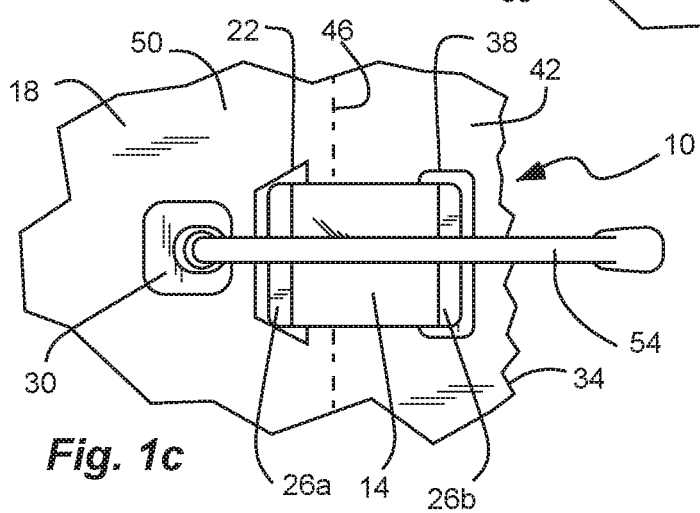
FIG. 1c schematically shows a partial top view of the electronic device of FIG. 1a with a bond wire.

FIG. 1c shows a schematic partial top view of the electronic device 10 of FIG. 1a with a bond wire 54. The bond wire 54 can extend to a substrate 58 or another die, as described in greater detail below. In addition, the bond wire 54 can extend over the decoupling capacitor 14.

Figure 1D:
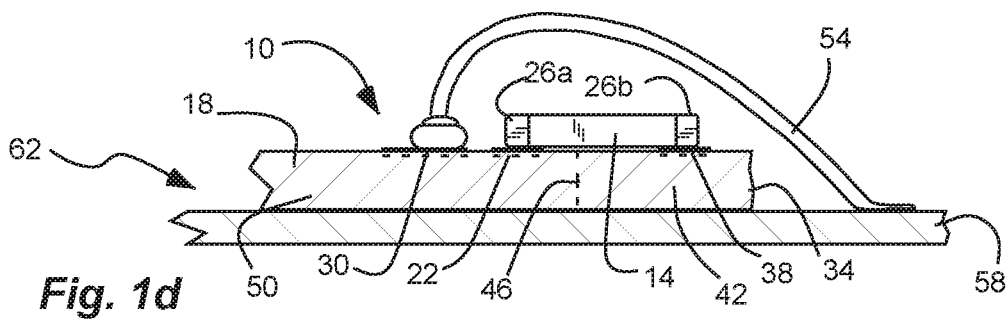
FIG. 1d schematically shows a partial side view of the electronic device of FIG. 1a with the decoupling capacitor mounted on the die and the bond wire.

FIG. 1d shows a schematic partial side view of the electronic device 10 of FIG. 1a with the bond wire 54. Again, the wire bond can extend over the decoupling capacitor 14. In one aspect, one of the bond pads 22 or 38 can be a power or signal bond pad to receive power or a signal, while the other bond pad 22 or 38 can be ground.

In addition, FIG. 1d shows an electronic device package 62; which can comprise the electronic device 10 and the substrate 58. The die 18 can be coupled to the substrate 58. The bond wire 54 is coupled between the target bond pad 30 of the die 18 and the substrate 58. In addition, the electronic device package 62 can comprise the decoupling capacitor 14 mounted on the die 18 and electrically coupled to the die 18.

Figure 2A:
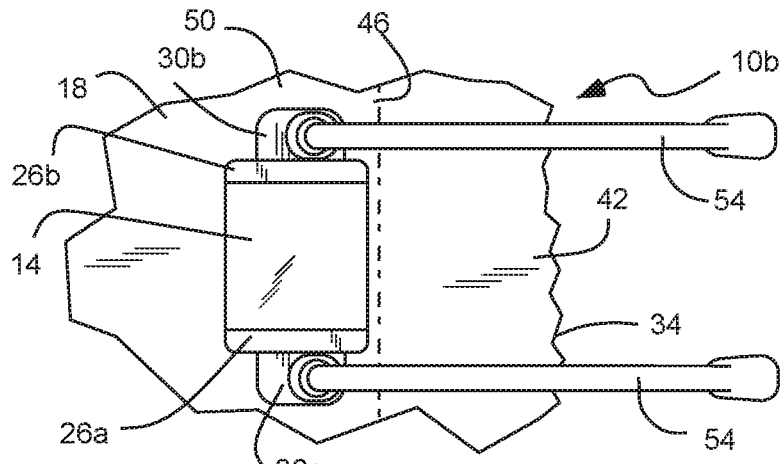
FIG. 2a schematically shows a partial top view of an electronic device with a decoupling capacitor mounted on a die in accordance with one example embodiment.
Figure 2B:
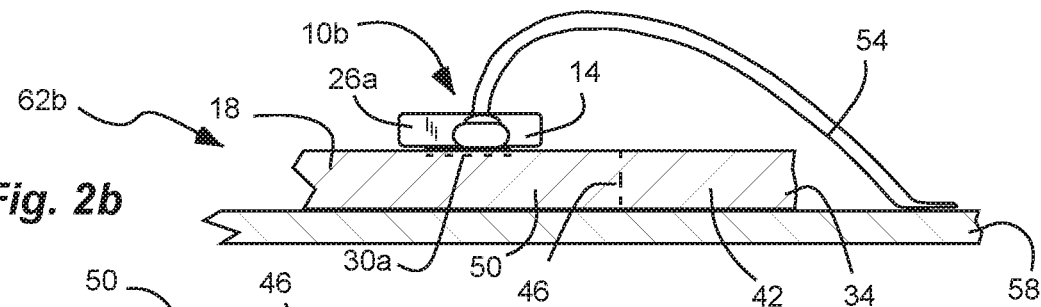

Referring to FIGS. 2a and 2b, a decoupling capacitor is shown mounted pad-to-pad on the same die in accordance with another example. FIG. 2a shows a schematic partial top view of an electronic device 10b having a decoupling capacitor 14 mounted on a die 18 in accordance with an example. FIG. 2b shows a schematic partial side view of an electronic device package 62b with the electronic device 10b of FIG. 2a. The bond pad can comprise a pair of adjacent bond pads 30a and 30b. In one aspect, the bond pads 30a and 30b can be target wire bond pads. As described above, the decoupling capacitor 14 has opposite contacts 26a and 26b. Each contact 26a and 26b is disposed on and electrically coupled to a different one of the pair of adjacent bond pads 30a and 30b. The pair of adjacent wire bond pads 30a and 30b can be exposed beyond the decoupling capacitor 14, or beyond the opposite contacts 26a and 26b, as shown. A pair of bond wires 54 each can be on a different one of the pair of adjacent wire bond pads 30a and 30b, with the decoupling capacitor 14 between the wire bond pads 30a and 30b. Thus, the space between the bond pads 30a and 30b, and between the wire bonds 54, can be utilized to locate a decoupling capacitor 14. In one aspect, one of the bond pads 30a can be a power or signal bond pad to receive power or a signal, while the other bond pad 30b can be ground.

In addition, FIG. 2b shows an electronic device package 62b; which can comprise the electronic device 10b and the substrate 58. As described above, the die 18 can be coupled to the substrate 58; and the bond wire 54 is coupled between the target bond pad 30 of the die 18 and the substrate 58. In addition, the electronic device package 62*b* can comprise the decoupling capacitor 14 mounted on the die 18 and electrically coupled to the die 18.

Figure 3A:
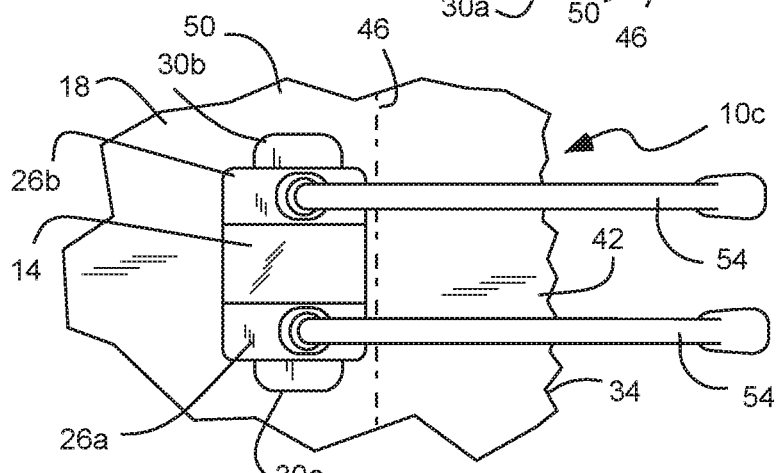
FIG. 3a schematically shows a partial top view of an electronic device with a decoupling capacitor mounted on a die in accordance with one example embodiment.
Figure 3B:
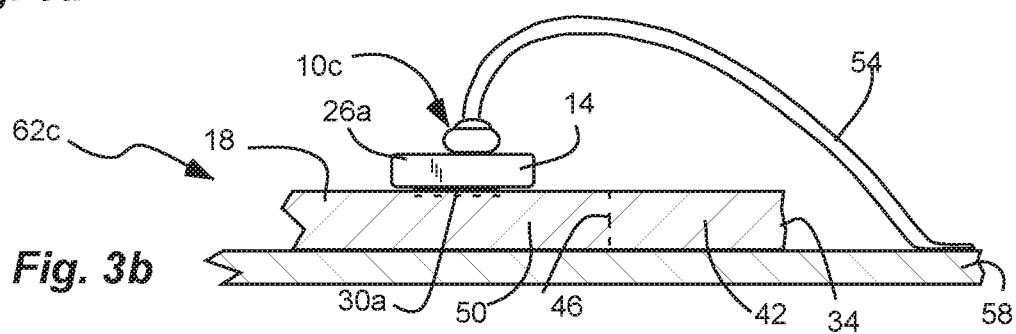

Referring to FIGS. 3*a* and 3*b*, a decoupling capacitor is shown mounted pad-to-pad on the same die, and with wire bonds directly onto the capacitor contacts, in accordance with another example. FIG. 3*a* shows a schematic partial top view of an electronic device 10*c* having a decoupling capacitor 14 mounted on a die 18 in accordance with an example. FIG. 3*b* shows a schematic partial side view of an electronic device package 62*c* with the electronic device 10*c* of FIG. 3*a*. As described above, the bond pad can comprise a pair of adjacent bond pads 30*a* and 30*b*, which can be target wire bond pads; and the decoupling capacitor 14 has opposite contacts 26*a* and 26*b*, each disposed on and electrically coupled to a different one of the pair of adjacent bond pads 30*a* and 30*b*. The pair of adjacent wire bond pads 30*a* and 30*b* can be substantially covered by the decoupling capacitor 14, or contacts 26*a* and 26*b* thereof, as shown. A pair of bond wires 54 each can be on a different one of opposite contacts 26*a* and 26*b* of the decoupling capacitor 14; and electrically coupled to the pair of adjacent wire bond pads 30*a* and 30*b* through the contacts 26*a* and 26*b* of the decoupling capacitor 14. Therefore, a space between the bond pads 30*a* and 30*b* and the wire bonds 54 can be utilized to locate a decoupling capacitor 14. In one aspect, one of the bond pads 30*a* can be a power or signal bond pad to receive power or a signal, while the other bond pad 30*b* can be ground.

In addition, FIG. 3*b* shows an electronic device package 62*c*; which can comprise the electronic device 10*c* and the substrate 58. As described above, the die 18 can be coupled to the substrate 58; and the bond wire 54 is coupled between the target bond pad 30 of the die 18 and the substrate 58. In addition, the electronic device package 62*c* can comprise the decoupling capacitor 14 mounted on the die 18 and electrically coupled to the die 18.

Figure 4A:
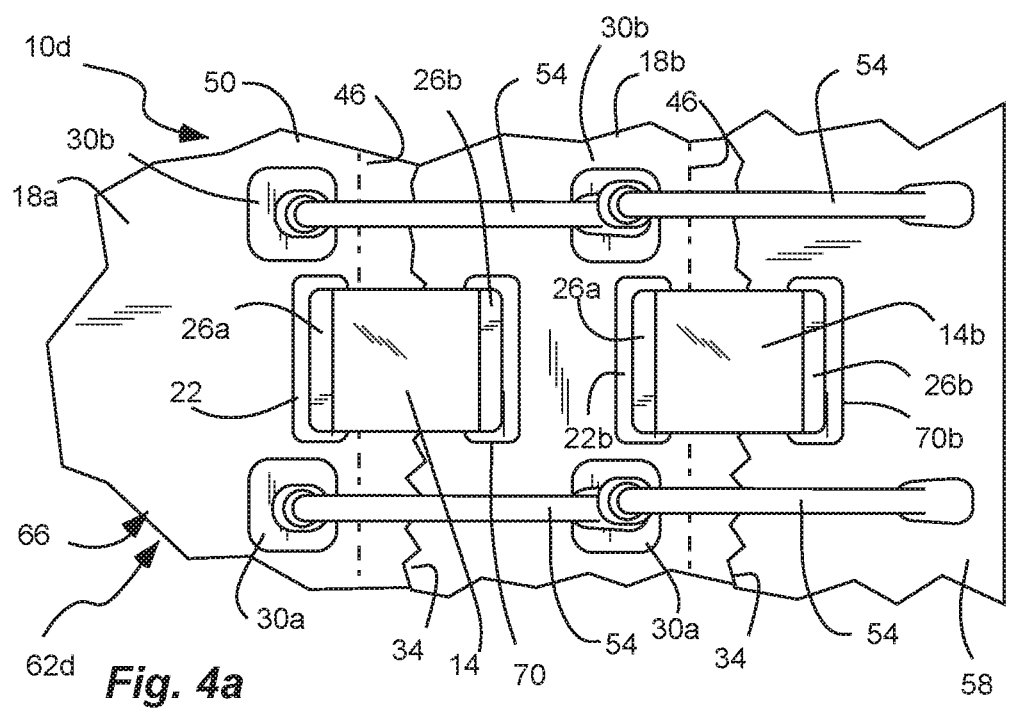
FIG. 4a schematically shows a partial top view of an electronic device with a decoupling capacitor mounted on a die in accordance with one example embodiment.
Figure 4B:
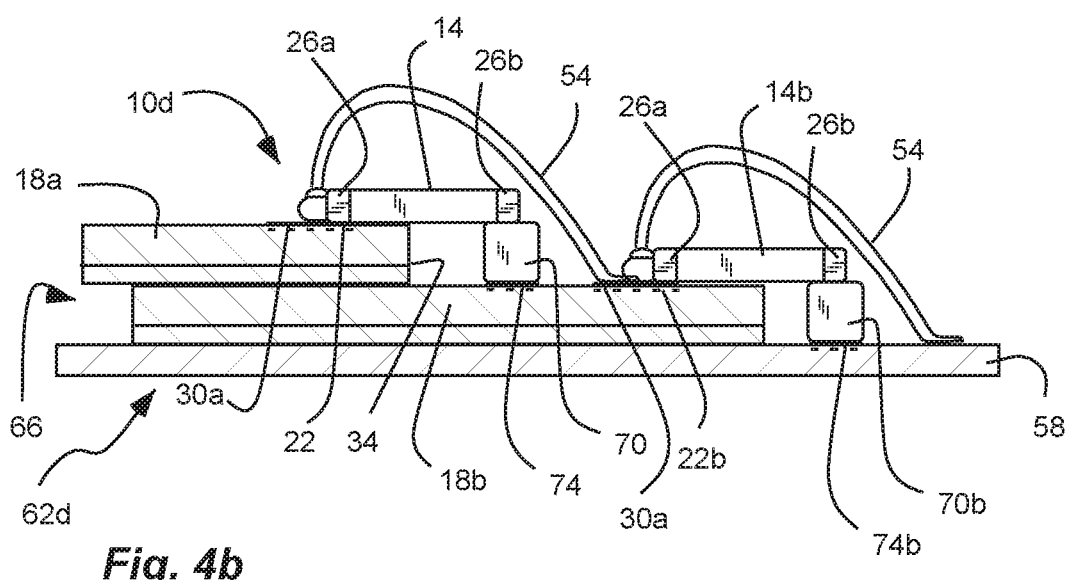

Referring to FIGS. 4*a* and 4*b*, a decoupling capacitor is shown mounted pad-to-pad on adjacent die in a die stack, and with a stand-off, in accordance with another example. FIG. 4*a* shows a schematic partial top view of an electronic device 10*d* having a decoupling capacitor 14 mounted on a pair of die 18*a* and 18*b* in accordance with an example. FIG. 4*b* shows a schematic partial side view of an electronic device package 62*d* with the electronic device 10*d* of FIG. 4*a*. The die can be an upper die 18*a* disposed on a lower die 18*b* in a die stack 66. In one aspect, the die stack 66 can be disposed on a substrate 58. The decoupling capacitor 14 has one contact 26*a* disposed on and electrically coupled to the bond pad 22 of the upper die 18*a*, and another contact 26*b* beyond the cut edge 34 of the upper die 18*a*. A standoff 70 can extend between a bond pad 74 (FIG. 4*b*) of the lower die 18*b* and the other contact 26*b* of the decoupling capacitor 14. The standoff 70 can be formed of a conductive material, e.g. metal. The standoff 70 can have a same height or thickness as the die 18*a*.

In addition, FIGS. 4*a* and 4*b* show a decoupling capacitor shown mounted pad-to-pad on an adjacent die and a substrate, and with a stand-off, in accordance with another example. The die can be the lower die 18*b* (but an upper die with respect to the substrate) disposed on the substrate 58. The decoupling capacitor 14*b* has one contact 26*a* disposed on and electrically coupled to the bond pad 22*b* of the lower die 18*b*, and another contact 26*b* beyond the cut edge 34 of the lower die 18*b*. A standoff 70*b* can extend between a bond pad 74*b* (FIG. 4*b*) of the substrate 58 and the other contact 26*b* of the decoupling capacitor 14*b*.

In addition, FIG. 4*b* shows an electronic device package 62*d*; which can comprise the electronic device 10*d* (and/or stack 66) and the substrate 58. As described above, the die 18*b* can be coupled to the substrate 58; and the bond wire 54 is coupled between the target bond pad 30*a* and/or 30*b* of the die 18*b* and the substrate 58, and between the target bond pads 30*a* and/or 30*b* of the top and bottom die 18*a* and 18*b*. In addition, the electronic device package 62*d* can comprise the decoupling capacitor 14*b* mounted on the bottom die 18*b* and electrically coupled to the bottom die 18*b*, and/or the decoupling capacitor 14*a* mounted on the top die 18*a* and electrically coupled to the top die 18*a*.

Figure 5A:
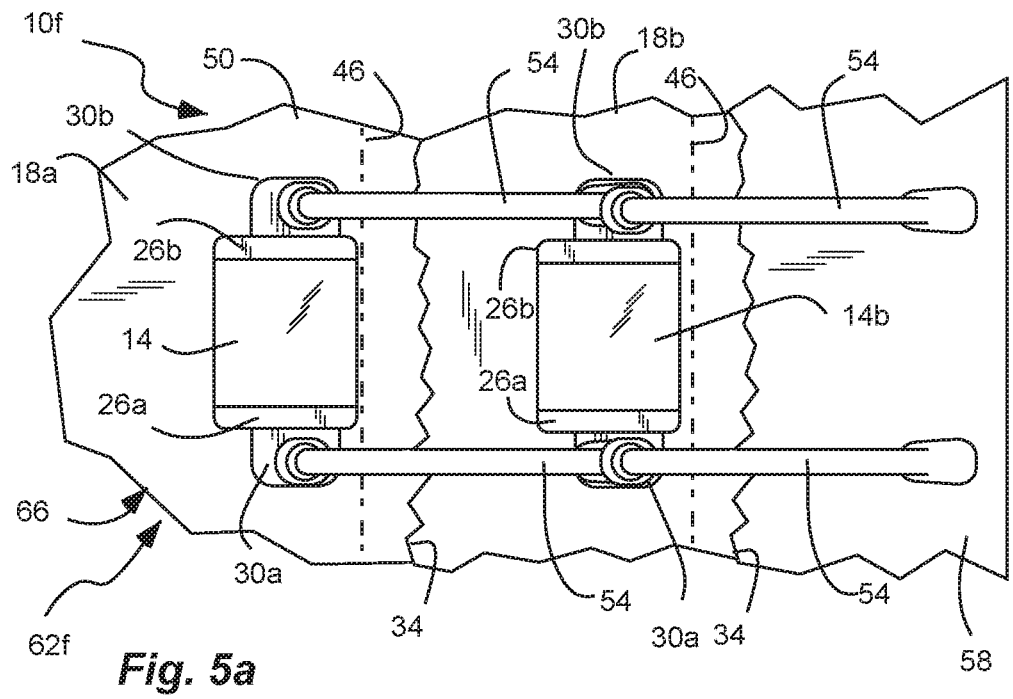
FIG. 5a schematically shows a partial top view of an electronic device with a decoupling capacitor mounted on a die in accordance with one example embodiment.
Figure 5B:
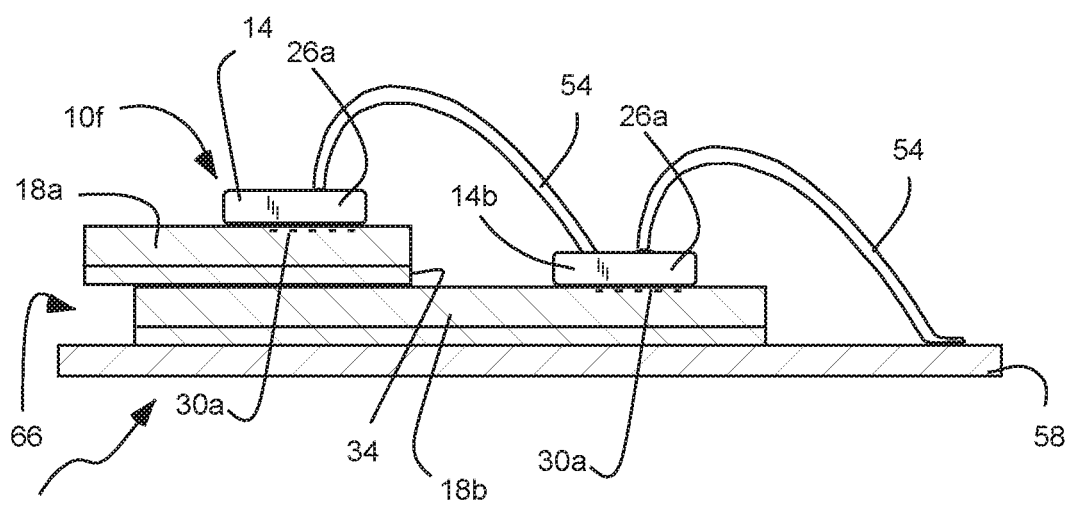

Referring to FIGS. 5*a* and 5*b*, a decoupling capacitor is shown mounted pad-to-pad on the same die, and with wire bonds directly onto the capacitor terminals, in accordance with another example. FIG. 5*a* shows a schematic partial top view of an electronic device package 62*f* with an electronic device 10*f* having a decoupling capacitor 14 or 14*b* mounted on a die 18*a* or 18*b* in accordance with an example. FIG. 5*b* shows a schematic partial side view of the electronic device package 62*f* with the electronic device 10*f* of FIG. 5*a*. The die can be an upper die 18*a* disposed on a lower die 18*b* in the die stack 66. The lower die 18*b* can be disposed on the substrate 58.

As described above, the bond pad can comprise a pair of adjacent bond pads 30*a* and 30*b*, which can be target wire bond pads; and the decoupling capacitor 14 or 14*b* has opposite contacts 26*a* and 26*b*, each disposed on and electrically coupled to a different one of the pair of adjacent bond pads 30*a* and 30*b*. The pair of adjacent wire bond pads 30*a* and 30*b* can be exposed beyond the decoupling capacitor 14 or 14*b*, or beyond the opposite contacts 26*a* and 26*b*, as shown. A pair of bond wires 54 each can be on a different one of the pair of adjacent wire bond pads 30*a* and 30*b*, with the decoupling capacitor 14 or 14*b* between the wire bond pads 30*a* and 30*b*, and between the bond wires 54.

Figure 6A:
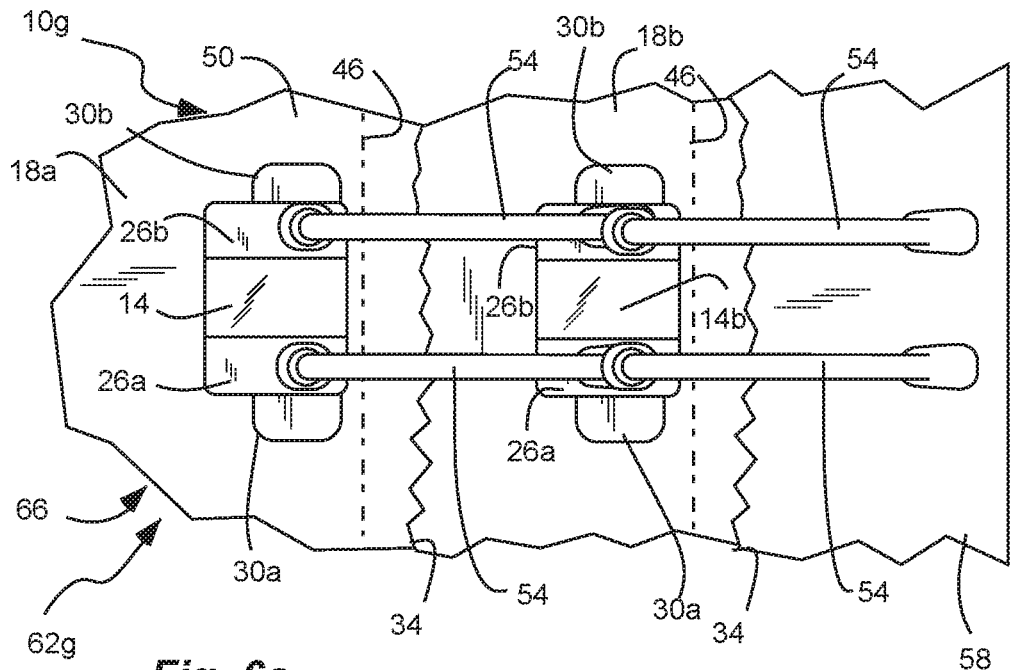
FIG. 6a schematically shows a partial top view of an electronic device with a decoupling capacitor mounted on a die in accordance with one example embodiment.
Figure 6B:
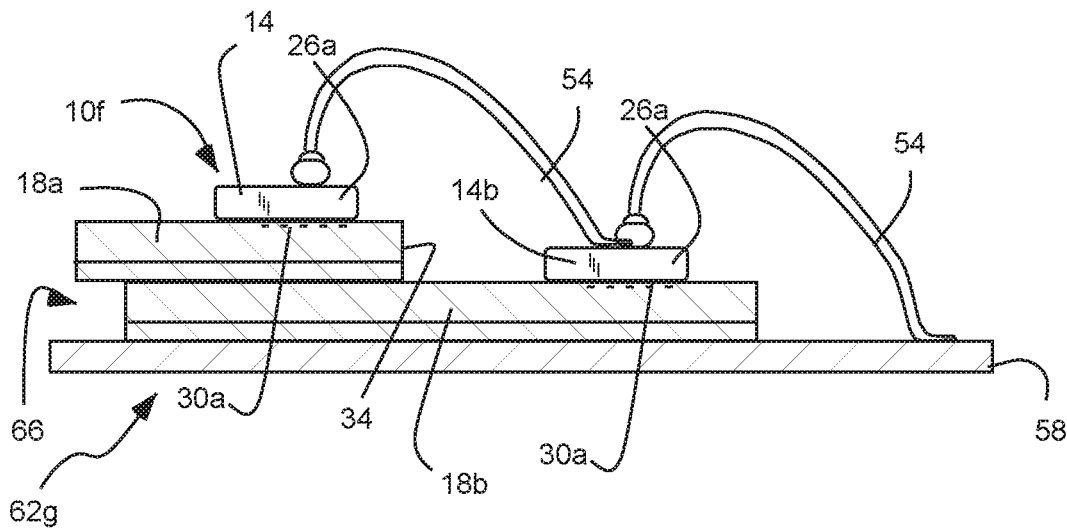

Referring to FIGS. 6*a* and 6*b*, a decoupling capacitor is shown mounted pad-to-pad on the same die, and with wire bonds directly onto the capacitor terminals, in accordance with another example. FIG. 6*a* shows a schematic partial top view of an electronic device package 62*g* with an electronic device 10*g* having a decoupling capacitor 14 or 14*b* mounted on a die 18*a* or 18*b* in accordance with an example. FIG. 6*b* shows a schematic partial side view of the electronic device package 62*g* with the electronic device 10*g* of FIG. 6*a*. The die can be an upper die 18*a* disposed on a lower die 18*b* in the die stack 66. The lower die 18*b* can be disposed on the substrate 58.

As described above, the bond pad can comprise a pair of adjacent bond pads 30*a* and 30*b*, which can be target wire bond pads; and the decoupling capacitor 14 or 14*b* has opposite contacts 26*a* and 26*b*, each disposed on and electrically coupled to a different one of the pair of adjacent bond pads 30*a* and 30*b*. The pair of adjacent wire bond pads 30*a* and 30*b* can be substantially covered by the decoupling capacitor 14 or 14*b*, or contacts 26*a* and 26*b* thereof, as shown. A pair of bond wires 54 each can be on a different one of opposite contacts 26*a* and 26*b* of the decoupling capacitor 14 or 14*b*; and electrically coupled to the pair of adjacent wire bond pads 30*a* and 30*b* through the contacts 26*a* and 26*b* of the decoupling capacitor 14 or 14*b*. Therefore, a space between the bond pads 30*a* and 30*b* and the wire bonds 54 can be utilized to locate a decoupling capacitor 14 or 14*b*.

In addition, a computing system can comprise a motherboard, and an electronic device package, as described above, operably coupled to the motherboard. The computing system can comprise a desktop computer, a laptop, a tablet, a smartphone, a server, a wearable electronic device, or a combination thereof. The computing system can further comprise a processor, a memory device, a heat sink, a radio, a slot, a port, or a combination thereof operably coupled to the motherboard.

Figure 7:
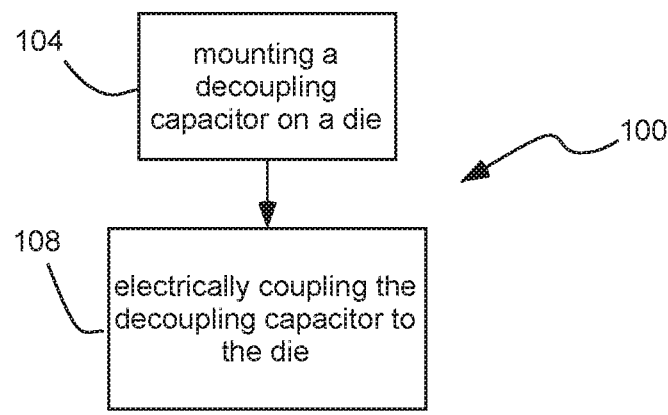
FIG. 7 illustrates a method in accordance with one example embodiment.

FIG. 7 illustrates a method 100 for making an electronics device, such as described with reference to FIGS. 1a-6b. The method 100 can comprise mounting 104a decoupling capacitor on a die; and electrically coupling 108 the decoupling capacitor to the die. In one aspect, mounting 104 the decoupling capacitor can further comprise mounting the decoupling capacitor directly on a surface of the die. In another aspect, the method can further comprise bonding a pair of bond wires each on a different one of a pair of adjacent wire bond pads with the decoupling capacitor therebetween. In another aspect, the method can further comprise bonding a pair of bond wires each on a different one of opposite contacts of the decoupling capacitor, and electrically coupling the bond wires to the pair of adjacent wire bond pads through the contacts of the decoupling capacitor.

In another aspect, the die can be an upper die, and the method can further comprise arranging the upper die on a lower die to form a die stack; disposing and electrically coupling one contact of the decoupling capacitor to the bond pad of the upper die; locating another contact of the decoupling capacitor beyond a cut edge of the upper die; and locating a standoff between a bond pad of the lower die and the another contact of the decoupling capacitor.

Figure 8:
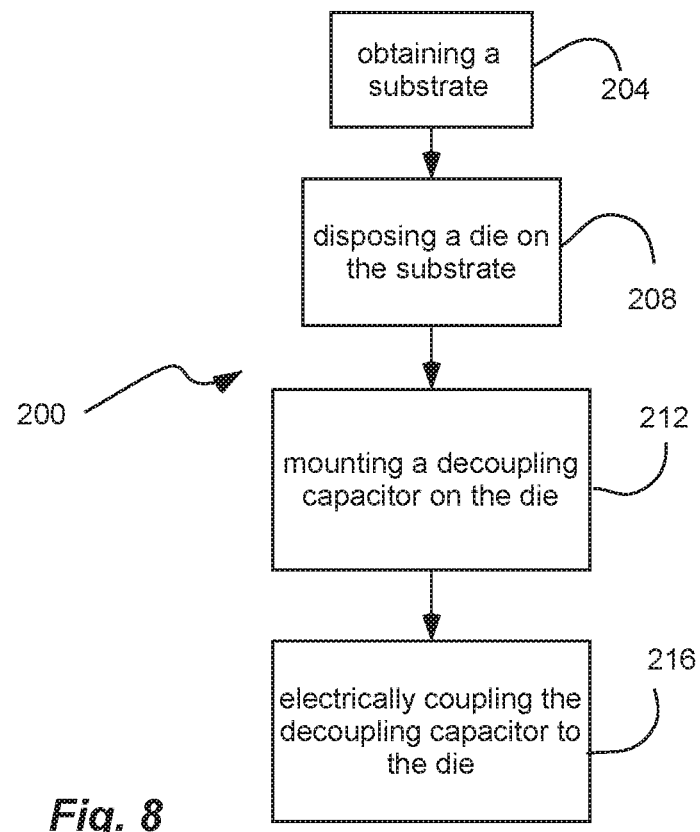
FIG. 8 illustrates a method in accordance with one example embodiment.

FIG. 8 illustrates a method 200 for making an electronics device package, such as described with reference to FIGS. 1a-6b. The method 200 can comprise obtaining 204a substrate; disposing 208a die on the substrate; mounting 212a decoupling capacitor on a die; and electrically coupling 216 the decoupling capacitor to the die. In one aspect, mounting the decoupling capacitor can further comprise mounting the decoupling capacitor directly on a surface of the die. In another aspect, the method can further comprise bonding a pair of bond wires each on a different one of the pair of adjacent wire bond pads with the decoupling capacitor therebetween. In another aspect, the method can further comprise bonding a pair of bond wires each on a different one of opposite contacts of the decoupling capacitor, and electrically coupling the bond wires to the pair of adjacent wire bond pads through the contacts of the decoupling capacitor.

In another aspect, the die is an upper die, and the method can further comprise arranging the upper die on a lower die to form a die stack; disposing and electrically coupling one contact of the decoupling capacitor to the bond pad of the upper die; locating another contact of the decoupling capacitor beyond a cut edge of the upper die; and locating a standoff between a bond pad of the lower die and the another contact of the decoupling capacitor.

EXAMPLES

The following examples pertain to further embodiments.

In one example there is provided an electronic device. The electronic device comprises a die having a bond pad; and a decoupling capacitor mounted on the die and electrically coupled to the die.

In one example of the electronic device, the decoupling capacitor is mounted directly on a surface of the die.

In one example of the electronic device, the decoupling capacitor is a surface mount capacitor with opposite contacts; and wherein one of the contacts is disposed on and electrically coupled to the bond pad.

In one example of the electronic device, the decoupling capacitor has a contact coupled to the bond pad with solder paste or conductive paste.

In one example of the electronic device, the bond pad is located adjacent to a target wire bond pad and between the target wire bond pad and a cut edge of the die.

In one example of the electronic device, the electronic device further comprises a corresponding bond pad in a scribe region of the die; and wherein the decoupling capacitor has opposite contacts with one contact disposed on and electrically coupled to the bond pad adjacent the target wire bond pad and another contact disposed on the corresponding bond pad in the scribe region.

In one example of the electronic device, the decoupling capacitor straddles a boundary between an active region of the die and a scribe region of the die.

In one example of the electronic device, the decoupling capacitor has opposite contacts with one contact in the active region of the die and another contact in the scribe region of the die.

In one example of the electronic device, the decoupling capacitor is disposed between a target wire bond pad and a cut edge of the die.

In one example of the electronic device, the bond pad comprises a pair of adjacent bond pads; and wherein the decoupling capacitor has opposite contacts each disposed on and electrically coupled to a different one of the pair of adjacent bond pads.

In one example of the electronic device, the pair of adjacent wire bond pads is exposed beyond the decoupling capacitor.

In one example of the electronic device, the electronic device further comprises a pair of bond wires each on a different one of the pair of adjacent wire bond pads with the decoupling capacitor therebetween.

In one example of the electronic device, the pair of adjacent wire bond pads is substantially covered by the decoupling capacitor.

In one example of the electronic device, the electronic device further comprises a pair of bond wires each on a different one of opposite contacts of the decoupling capacitor, and electrically coupled to the pair of adjacent wire bond pads through the contacts of the decoupling capacitor.

In one example of the electronic device, the die is an upper die disposed on a lower die in a die stack; and wherein the decoupling capacitor has one contact disposed on and electrically coupled to the bond pad of the upper die and another contact beyond a cut edge of the upper die; and further comprising a standoff extending between a bond pad of the lower die and the another contact of the decoupling capacitor.

In one example there is provided an electronic device package. The electronic device package comprises a substrate; a die coupled to the substrate and having a target bond pad; a bond wire coupled between the target bond pad and the substrate; and a decoupling capacitor mounted on the die and electrically coupled to the die.

In one example of the electronic device package, the decoupling capacitor is mounted directly on a surface of the die.

In one example of the electronic device package, the decoupling capacitor is a surface mount capacitor with opposite contacts; and wherein one of the contacts is disposed on and electrically coupled to a bond pad.

In one example of the electronic device package, the decoupling capacitor has a contact coupled to the bond pad with solder paste or conductive paste.

In one example of the electronic device package, the bond pad is located adjacent to the target wire bond pad and between the target wire bond pad and a cut edge of the die.

In one example of the electronic device package, the electronic device package further comprises a corresponding bond pad in a scribe region of the die; and wherein the decoupling capacitor has opposite contacts with one contact disposed on and electrically coupled to the bond pad adjacent the target wire bond pad and another contact disposed on the corresponding bond pad in the scribe region.

In one example of the electronic device package, the decoupling capacitor straddles a boundary between an active region of the die and a scribe region of the die.

In one example of the electronic device package, the decoupling capacitor has opposite contacts with one contact in the active region of the die and another contact in the scribe region of the die.

In one example of the electronic device package, the decoupling capacitor is disposed between the target wire bond pad and a cut edge of the die.

In one example of the electronic device package, the target bond pad comprises a pair of adjacent bond pads; and wherein the decoupling capacitor has opposite contacts each disposed on and electrically coupled to a different one of the pair of adjacent bond pads.

In one example of the electronic device package, the pair of adjacent wire bond pads is exposed beyond the decoupling capacitor.

In one example of the electronic device package, the electronic device package further comprises a pair of bond wires each on a different one of the pair of adjacent wire bond pads with the decoupling capacitor therebetween.

In one example of the electronic device package, the pair of adjacent wire bond pads is substantially covered by the decoupling capacitor.

In one example of the electronic device package, the electronic device package further comprises a pair of bond wires each on a different one of opposite contacts of the decoupling capacitor, and electrically coupled to the pair of adjacent wire bond pads through the contacts of the decoupling capacitor.

In one example of the electronic device package, the die is an upper die disposed on a lower die in a die stack; and wherein the decoupling capacitor has one contact disposed on and electrically coupled to the bond pad of the upper die and another contact beyond a cut edge of the upper die; and further comprising a standoff extending between a bond pad of the lower die and the another contact of the decoupling capacitor.

In one example there is provided computing system. The computing system comprises a motherboard; and an electronic device package as in any one of above examples operably coupled to the motherboard.

In one example of the computing system, the computing system comprises a desktop computer, a laptop, a tablet, a smartphone, a server, a wearable electronic device, or a combination thereof.

In one example of the computing system, the computing system further comprises a processor, a memory device, a heat sink, a radio, a slot, a port, or a combination thereof operably coupled to the motherboard.

In one example there is provided a method for making an electronic device. The method comprises mounting a decoupling capacitor on a die; and electrically coupling the decoupling capacitor to the die.

In one example of the method, the method further comprises mounting the decoupling capacitor directly on a surface of the die.

In one example of the method, the decoupling capacitor is a surface mount capacitor with opposite contacts; and further comprising disposing and electrically coupling one of the contacts to the bond pad of the die.

In one example of the method, the bond pad is located adjacent to a target wire bond pad and between the target wire bond pad and a cut edge of the die.

In one example of the method, the method further comprises a corresponding bond pad in a scribe region of the die; and wherein the decoupling capacitor has opposite contacts; and further comprising disposing and electrically coupling the opposite contact to the bond pad adjacent the target wire bond pad and the corresponding bond pad in the scribe region.

In one example of the method, the method further comprises locating the decoupling capacitor to straddle a boundary between an active region of the die and a scribe region of the die.

In one example of the method, the decoupling capacitor has opposite contacts; and further comprising locating the decoupling capacitor with one contact in the active region of the die and another contact in the scribe region of the die.

In one example of the method, the decoupling capacitor is disposed between a target wire bond pad and a cut edge of the die.

In one example of the method, the bond pad comprises a pair of adjacent bond pads; and wherein the decoupling capacitor has opposite contacts; and further comprising disposing and electrically coupling each of the opposite contacts to a different one of the pair of adjacent bond pads.

In one example of the method, the pair of adjacent wire bond pads is exposed beyond the decoupling capacitor.

In one example of the method, the method further comprises bonding a pair of bond wires each on a different one of the pair of adjacent wire bond pads with the decoupling capacitor therebetween.

In one example of the method, the pair of adjacent wire bond pads is substantially covered by the decoupling capacitor.

In one example of the method, the method further comprises bonding a pair of bond wires each on a different one of opposite contacts of the decoupling capacitor, and electrically coupling the bond wires to the pair of adjacent wire bond pads through the contacts of the decoupling capacitor.

In one example of the method, the die is an upper die; and further comprising: arranging the upper die on a lower die to form a die stack; disposing and electrically coupling one contact of the decoupling capacitor to the bond pad of the upper die; locating another contact of the decoupling capacitor beyond a cut edge of the upper die; and locating a standoff between a bond pad of the lower die and the another contact of the decoupling capacitor.

In one example there is provided a method for making an electronic device package. The method comprises: obtaining a substrate; disposing a die on the substrate; mounting a decoupling capacitor on a die; and electrically coupling the decoupling capacitor to the die.

In one example of the method, the method further comprises mounting the decoupling capacitor directly on a surface of the die.

In one example of the method, the decoupling capacitor is a surface mount capacitor with opposite contacts; and further comprising disposing and electrically coupling one of the contacts the bond pad of the die.

In one example of the method, the bond pad is located adjacent to a target wire bond pad and between the target wire bond pad and a cut edge of the die.

In one example of the method, the method further comprises a corresponding bond pad in a scribe region of the die; and wherein the decoupling capacitor has opposite contacts; and further comprising disposing and electrically coupling the opposite contact to the bond pad adjacent the target wire bond pad and the corresponding bond pad in the scribe region.

In one example of the method, the method further comprising locating the decoupling capacitor to straddle a boundary between an active region of the die and a scribe region of the die.

In one example of the method, the decoupling capacitor has opposite contacts; and further comprising locating the decoupling capacitor with one contact in the active region of the die and another contact in the scribe region of the die.

In one example of the method, the decoupling capacitor is disposed between a target wire bond pad and a cut edge of the die.

In one example of the method, the bond pad comprises a pair of adjacent bond pads; and wherein the decoupling capacitor has opposite contacts; and further comprising disposing and electrically coupling each of the opposite contacts to a different one of the pair of adjacent bond pads.

In one example of the method, the pair of adjacent wire bond pads is exposed beyond the decoupling capacitor.

In one example of the method, the method further comprises bonding a pair of bond wires each on a different one of the pair of adjacent wire bond pads with the decoupling capacitor therebetween.

In one example of the method, the pair of adjacent wire bond pads is substantially covered by the decoupling capacitor.

In one example of the method, the method further comprises bonding a pair of bond wires each on a different one of opposite contacts of the decoupling capacitor, and electrically coupling the bond wires to the pair of adjacent wire bond pads through the contacts of the decoupling capacitor.

In one example of the method, the die is an upper die; and further comprising: arranging the upper die on a lower die to form a die stack; disposing and electrically coupling one contact of the decoupling capacitor to the bond pad of the upper die; locating another contact of the decoupling capacitor beyond a cut edge of the upper die; and locating a standoff between a bond pad of the lower die and the another contact of the decoupling capacitor.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device, comprising:
   a substrate;
   a die mounted directly on the substrate, the die having a bond pad;
   a decoupling capacitor mounted directly on the die and directly electrically coupled to the die, the decoupling capacitor having a first contact and a second contact, wherein one of the first contact or the second contact of the decoupling capacitor is in direct contact with the bond pad of the die;
   a first bond wire in direct contact with the first contact of the decoupling capacitor, the first bond wire extending directly to the substrate; and
   a second bond wire in direct contact with the second contact of the decoupling capacitor, the second bond wire extending directly to the substrate.

2. The electronic device of claim 1, wherein the decoupling capacitor is mounted directly on a surface of the die.

3. The electronic device of claim 1, wherein the decoupling capacitor is a surface mount capacitor with opposite contacts; and
   wherein one of the contacts is disposed on and electrically coupled to the bond pad.

4. The electronic device of claim 1, wherein the bond pad is located adjacent to a target wire bond pad and between the target wire bond pad and a cut edge of the die.

5. The electronic device of claim 4, further comprising a corresponding bond pad in a scribe region of the die; and
   wherein the decoupling capacitor has opposite contacts with one contact disposed on and electrically coupled to the bond pad adjacent the target wire bond pad and another contact disposed on the corresponding bond pad in the scribe region.

6. The electronic device of claim 1, wherein the decoupling capacitor straddles a boundary between an active region of the die and a scribe region of the die.

7. The electronic device of claim 6, wherein the decoupling capacitor has opposite contacts with one contact in the active region of the die and another contact in the scribe region of the die.

8. The electronic device of claim 1, wherein the decoupling capacitor is disposed between a target wire bond pad and a cut edge of the die.

9. The electronic device of claim 1, wherein the bond pad comprises a pair of adjacent bond pads; and
   wherein the decoupling capacitor has opposite contacts each disposed on and electrically coupled to a different one of the pair of adjacent bond pads.

10. The electronic device of claim 9, wherein the pair of adjacent wire bond pads is exposed beyond the decoupling capacitor.

11. The electronic device of claim 10, further comprising a pair of bond wires each on a different one of the pair of adjacent wire bond pads with the decoupling capacitor therebetween.

12. The electronic device of claim 9, wherein the pair of adjacent wire bond pads is substantially covered by the decoupling capacitor.

13. The electronic device of claim 12, further comprising a pair of bond wires each on a different one of opposite contacts of the decoupling capacitor, and electrically coupled to the pair of adjacent wire bond pads through the contacts of the decoupling capacitor.

14. The electronic device of claim 1, wherein the die is an upper die disposed on a lower die in a die stack; and wherein the decoupling capacitor has one contact disposed on and electrically coupled to the bond pad of the upper die and another contact beyond a cut edge of the upper die; and further comprising a standoff extending between a bond pad of the lower die and the another contact of the decoupling capacitor.

15. A method for making an electronic device, comprising:
- mounting a die directly on a substrate, the die having a bond pad;
- mounting a decoupling capacitor directly on the die, the decoupling capacitor having a first contact and a second contact, wherein one of the first contact or the second contact of the decoupling capacitor is in direct contact with the bond pad of the die;
- directly electrically coupling the decoupling capacitor to the die;
- connecting a first wire bond directly to the first contact of the capacitor, the first wire bond extending directly to the substrate; and
- connecting a second wire bond directly to the second contact of the capacitor, the second wire bond extending directly to the substrate.

16. The method of claim 15, further comprising mounting the decoupling capacitor directly on a surface of the die.

17. The method of claim 15, wherein the decoupling capacitor is a surface mount capacitor with opposite contacts; and further comprising disposing and electrically coupling one of the contacts to the bond pad of the die.

18. The method of claim 15, wherein the bond pad is located adjacent to a target wire bond pad and between the target wire bond pad and a cut edge of the die.

19. The method of claim 18, further comprising a corresponding bond pad in a scribe region of the die; and wherein the decoupling capacitor has opposite contacts; and further comprising disposing and electrically coupling the opposite contact to the bond pad adjacent the target wire bond pad and the corresponding bond pad in the scribe region.

20. The method of claim 15, further comprising locating the decoupling capacitor to straddle a boundary between an active region of the die and a scribe region of the die.

21. The method of claim 20, wherein the decoupling capacitor has opposite contacts; and further comprising locating the decoupling capacitor with one contact in the active region of the die and another contact in the scribe region of the die.

22. The method of claim 15, wherein the decoupling capacitor is disposed between a target wire bond pad and a cut edge of the die.

23. The method of claim 15, wherein the bond pad comprises a pair of adjacent bond pads; and wherein the decoupling capacitor has opposite contacts; and further comprising disposing and electrically coupling each of the opposite contacts to a different one of the pair of adjacent bond pads.

24. The method of claim 23, wherein the pair of adjacent wire bond pads is exposed beyond the decoupling capacitor.

25. The method of claim 24, further comprising bonding a pair of bond wires each on a different one of the pair of adjacent wire bond pads with the decoupling capacitor therebetween.

26. The method of claim 23, wherein the pair of adjacent wire bond pads is substantially covered by the decoupling capacitor.

27. The method of claim 26, further comprising bonding a pair of bond wires each on a different one of opposite contacts of the decoupling capacitor, and electrically coupling the bond wires to the pair of adjacent wire bond pads through the contacts of the decoupling capacitor.

28. The method of claim 15, wherein the die is an upper die; and further comprising:
- arranging the upper die on a lower die to form a die stack;
- disposing and electrically coupling one contact of the decoupling capacitor to the bond pad of the upper die;
- locating another contact of the decoupling capacitor beyond a cut edge of the upper die; and
- locating a standoff between a bond pad of the lower die and the another contact of the decoupling capacitor.

29. An electronic device, comprising:
- a substrate;
- a die mounted directly on the substrate, the die having a bond pad; and
- a decoupling capacitor mounted directly on the die and directly electrically coupled to the die, wherein the decoupling capacitor straddles a boundary between an active region of the die and a scribe region of the die, and wherein an contact of the decoupling capacitor is in direct contact with the bond pad of the die.

30. An electronic device, comprising:
- a substrate;
- a die mounted directly on the substrate, the die having a bond pad; and
- a decoupling capacitor mounted directly on the die and directly electrically coupled to the die, wherein the die is an upper die disposed on a lower die in a die stack; and wherein the decoupling capacitor has one contact in direct contact with and electrically coupled to the bond pad of the upper die and another contact beyond a cut edge of the upper die; and further comprising a standoff extending between a bond pad of the lower die and the another contact of the decoupling capacitor.

\* \* \* \* \*